United States Patent [19]

Scott

[11] 4,176,304
[45] Nov. 27, 1979

[54] REGULATING TELEVISION HORIZONTAL DEFLECTION ARRANGEMENT

[75] Inventor: Howard M. Scott, Moorestown, N.J.

[73] Assignee: RCA Corporation, New York, N.Y.

[21] Appl. No.: 904,451

[22] Filed: May 9, 1978

[51] Int. Cl.² ............................................. H01J 29/00
[52] U.S. Cl. ................................................... 315/411
[58] Field of Search ......................................... 315/411

[56] References Cited
U.S. PATENT DOCUMENTS

| | | | |
|---|---|---|---|
| 3,887,840 | 6/1975 | Maytum | 315/411 X |
| 4,013,923 | 3/1977 | Hollander | 315/411 |
| 4,042,859 | 8/1977 | Kashiwagi | 315/411 |
| 4,079,294 | 3/1978 | Teuling | 315/411 |
| 4,090,111 | 5/1978 | Susuki | 315/411 |
| 4,101,815 | 7/1978 | Willis | 315/411 |
| 4,126,816 | 11/1978 | Willis | 315/411 |

Primary Examiner—Malcolm F. Hubler
Attorney, Agent, or Firm—Eugene M. Whitacre; Paul J. Rasmussen; William H. Meise

[57] ABSTRACT

A source of unregulated direct voltage is commutated at the horizontal rate by a two-transistor switching regulator and applied across a transformer primary winding. The duty cycle of the alternations is controlled to maintain the peak-to-average value of a first portion of the alternations at a constant value. A rectifier serially coupled with a capacitor is coupled across the secondary winding of the transformer and produces a direct voltage across the capacitor from the first portion of the alternations. The junction of the rectifier and secondary winding is grounded. A television horizontal output transistor has its emitter grounded and its collector coupled through an inductance to the other end of the rectifier. A constant energy is stored in the inductance during each deflection cycle for application to the horizontal output stage. The horizontal output transistor is one of the two regulator transistors.

6 Claims, 8 Drawing Figures

REGULATING TELEVISION HORIZONTAL DEFLECTION ARRANGEMENT

BACKGROUND OF THE INVENTION

This invention relates to television horizontal deflection circuits which regulate the deflection magnitude against changes in the supply voltage.

It is advantageous both from the point of view of cost and because of weight consideration to derive the direct operating voltages for a television receiver by rectification of the alternating current power from the ac power lines without the use of a power-line frequency transformer. The voltages so derived, however, may not be at a value suited for use in low-voltage stages of a receiver without excessive waste of power. Also, the ac input voltage varies significantly from time to time and is not suited for powering stages sensitive to such changes. In particular, the horizontal output stage, if supplied with unregulated voltage, may scan the kinescope to form a raster of varying width. It is desirable to regulate the horizontal scanning width by control of the scanning energy, and to step down the voltage derived from rectification of the ac power for use in low-voltage parts of the receiver.

A horizontal deflection circuit which regulates the deflection amplitude against changes in the unregulated direct supply voltage is described in an article entitled "A New Horizontal Deflection Circuit" by Peter L. Wessel, published in the IEEE Transactions on Broadcast and Television Receivers, Volumn BTR-18, August 1972. This horizontal deflection circuit is described as a combined switched-mode power supply and trace-driven deflection circuit, and uses a single switch transistor. Unregulated direct voltage is applied to the collector of the switching transistor through the primary of a transformer, the secondary of which is coupled to the deflection winding through a diode poled to conduct and thereby supply energy to the retrace capacitor during the retrace interval. The switch transistor is supplied with base drive from a control circuit which provides for switch transistor conduction during the last half of the horizontal trace interval, and which also provides for regulation of the deflection energy by controlling the time during the first half of trace during which the switch transistor is conductive.

The described Wessel circuit requires a complex control circuit which is used solely for control of the deflection energy. Also, the transformer is operated with an average direct current flow in both the primary and secondary windings, which causes the magnetic core to be operated away from the point of maximum permeability and requires the use of a larger core than would be the case without an average direct current flow.

U.S. Pat. No. 3,967,182 issued on June 29, 1976 in the name of Howard M. Scott describes a regulated switched mode power supply with multiple outputs in which the unregulated direct voltage input is chopped by a pair of switching transistors and applied to the primary of a transformer. The output voltages are taken from secondary windings of the transformer by half-wave rectification and filtration. The output voltages are maintained constant against changes in the unregulated direct voltage input by a control circuit coupled to the switching transistors which varies the duty cycle or ON-OFF periods of the switching transistors so as to maintain the average primary winding current at zero and also to maintain the secondary voltage constant during the conduction interval of the half-wave rectifiers.

The aforementioned Scott arrangement provides for a reduction in transformer size by virtue of the low primary winding direct current, and also provides multiple regulated output voltages which, by transformer action, may be greater or less than the input voltage. However, where the horizontal output stage is one of the loads being energized, the secondary winding supplying the half-wave rectified power thereto has a substantial average direct-current component which tends to increase the required transformer size. Also, such a combined arrangement is relatively complex.

It is desirable to have a simple structure providing regulated energy for horizontal deflection and regulated voltages for high or low-voltage portions of the receiver. It is also desirable to have reduced transformer size resulting from reduction in average direct current in the transformer windings.

SUMMARY OF THE INVENTION

A source of alternating voltage provides voltages cycling at the horizontal deflection rate between first and second magnitudes relative to an average level. The second magnitude is variable and the first magnitude is maintained constant by variation of the relative duration during each cycle of first and second intervals, respectively, during which the first and second voltage magnitudes occur. A transformer has a primary winding coupled to the source of alternating voltage and has a secondary winding. A storage capacitor is coupled to the secondary winding by a rectifier poled for charging of the capacitor during the first intervals. A horizontal deflection stage includes a horizontal switching transistor having a controlled main conduction path across which a horizontal deflection winding is coupled. An inductance couples the transistor main conduction path across the rectifier for applying the sum of the capacitor voltage and transformer secondary voltage to the inductance during the second intervals for causing a constant energy to be stored in the inductance during each deflection cycle for transfer to the horizontal output stage.

DESCRIPTION OF THE INVENTION

Figure 1:
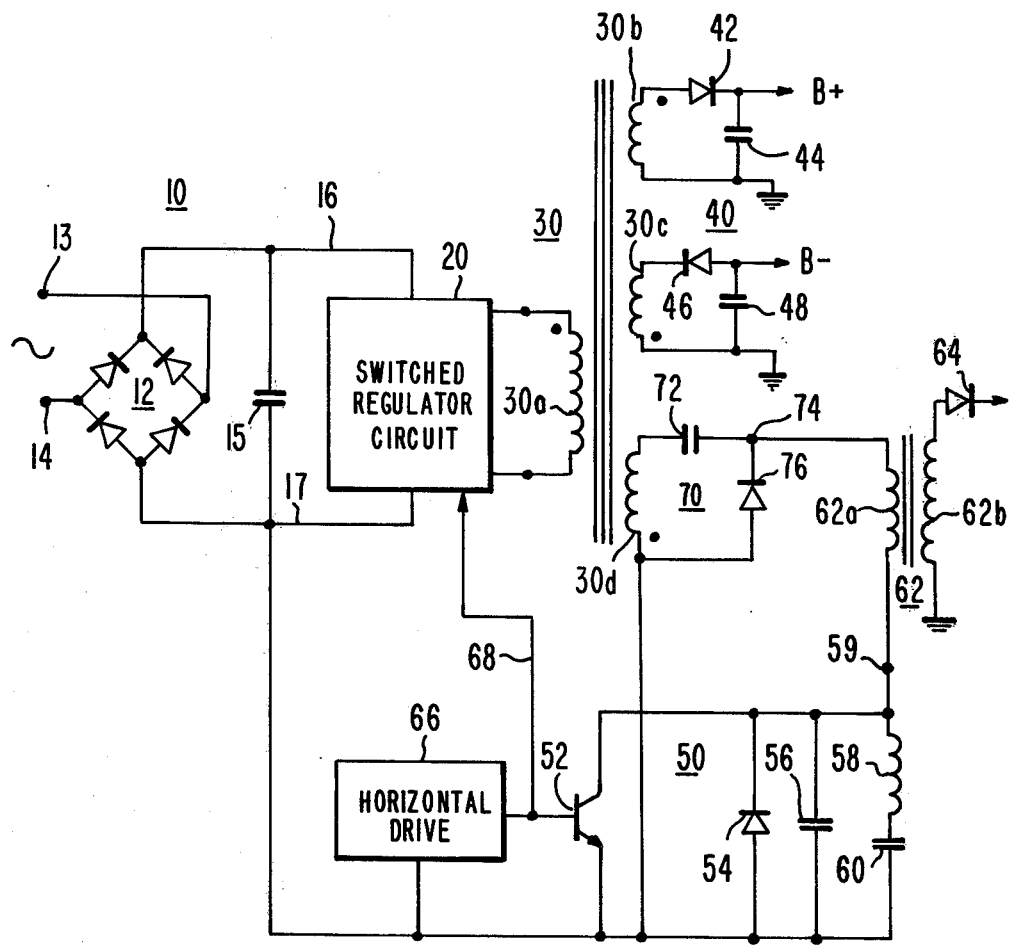
FIGS. 1 and 3 illustrate in schematic and block diagram form a portion of a television receiver embodying the invention.

FIG. 1 illustrates generally a power supply 10 for producing direct voltage from the power mains. The direct voltage is applied by way of conductor or bus line 16 and a conductor 17 (hereinafter called "ground 17") to a switched regulator 20 at the center of FIG. 1, which drives rectifier-filter circuits 40 and 70. Rectifier-filter circuit 70 energizes a horizontal deflection circuit designated generally as 50.

In FIG. 1, power supply 10 includes a bridge rectifier 12 coupled to the power mains at terminals 13 and 14, and produces a pulsating direct current on conductor or bus line 16 and ground 17 which is filtered to a direct operating voltage by a capacitor 15 coupled between conductor 16 and ground 17. A regulator circuit 20 commutates or chops the unregulated direct voltage appearing between bus 16 and ground 17 and applies it across a primary winding 30a of a transformer 30. Power supply circuit 40 includes a B+ supply and a B— supply. The B+ supply includes a secondary winding 30b of transformer 30, a half-wave rectifier diode 42, and a storage capacitor 44 having one end connected to ground and the other end to the cathode of diode 42. Similarly, the B— supply includes another secondary winding 30c having one end grounded and the other end connected to the cathode of a half-wave rectifier diode 46. A storage capacitor 48 has one end grounded and the other end connected to the anode of diode 46. Circuit 70 includes a secondary winding 30d having one end coupled to ground 17 and the other end connected to one end of a storage capacitor 72. The other end of capacitor 72 is coupled at a terminal 74 to the cathode of a rectifier diode 76, the anode of which is connected to ground 17. Horizontal deflection energizing voltage appearing at terminal 74 relative to ground 17 is applied across the primary winding 62a of a high voltage transformer 62 and to the remainder of horizontal deflection circuit 50. One end of the secondary winding 62b of transformer 62 is grounded and the other end is connected to an ultor voltage rectifier represented by a diode 64, the cathode of which is coupled to the ultor of a kinescope, not shown.

The end of winding 62a remote from terminal 74 is connected to the collector of a horizontal switching transistor 52, the emitter of which is coupled to ground 17. A damper diode 54 has its cathode connected to the collector and its anode connected to the emitter, respectively, of transistor 52. A retrace capacitor 56 is coupled across diode 54, and the serial combination of a horizontal deflection winding 58 and an S-shaping capacitor 60 is coupled across capacitor 56.

Figure 2:
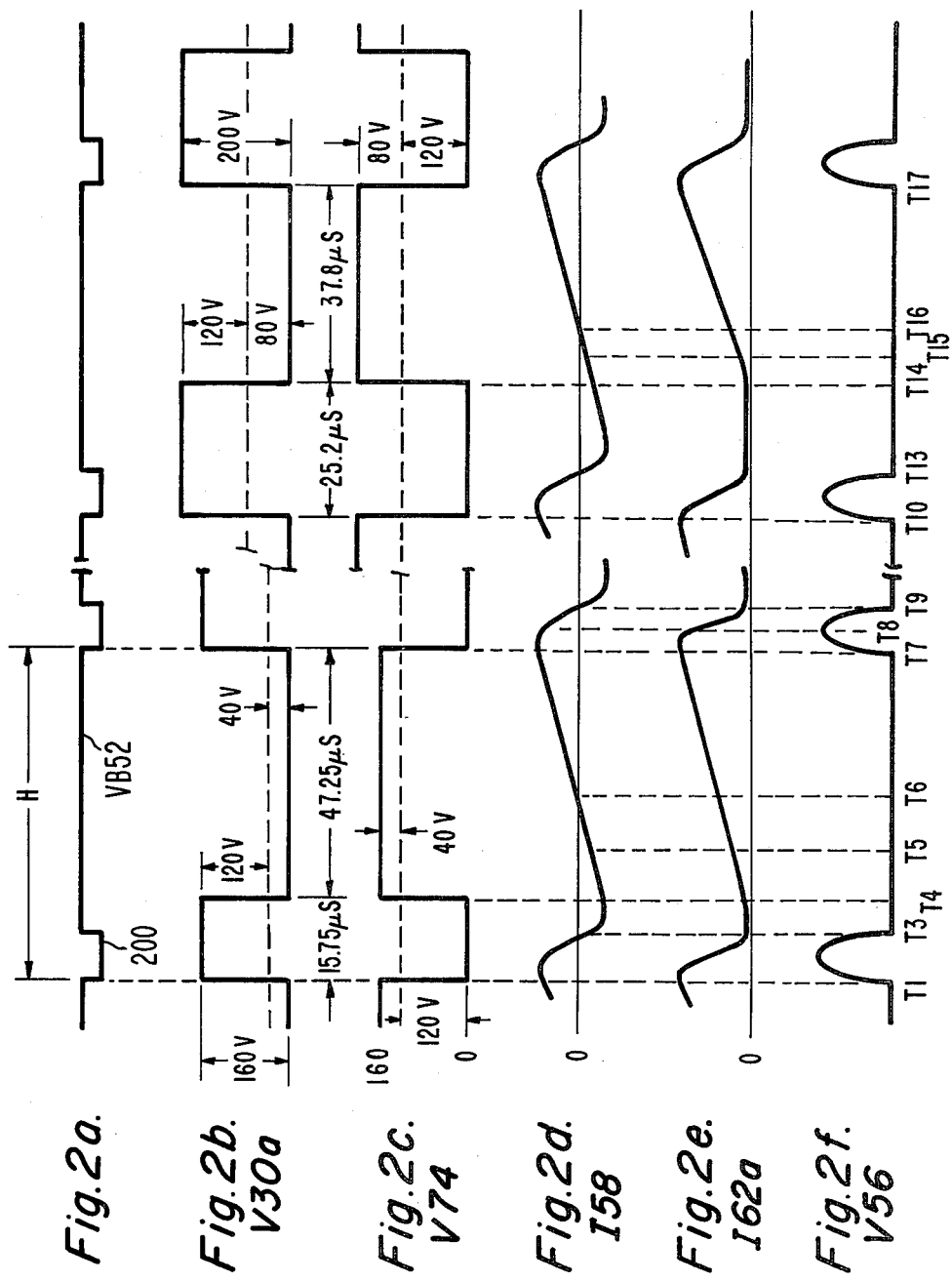
FIGS. 2a–2f illustrates amplitude-time voltage and current waveforms occurring in the arrangement of FIGS. 1 and 3.

Horizontal output transistor switching signals VB52 as illustrated in FIG. 2a are produced by a horizontal drive circuit 66 coupled to the base of transistor 52 and include a negative-going synchronizing pulse portion 200 and a portion poled to render transistor 52 conductive. The horizontal switching signals produced by drive circuit 66 are synchronized with horizontal synchronizing signals produced in known fashion in other portions of the television receiver, not shown. Switched regulator circuit 20, which may be of the type described in the aforementioned Scott patent, receives synchronizing pulses 200 over a conductor 68 from horizontal drive circuit 66 to synchronize the switching of the regulator with the horizontal deflection signals.

As described in the Scott patent, the unregulated direct voltage appearing across bus conductor 16 and ground 17 is applied across windings 30a in such a manner as to simultaneously maintain the time average of the positive and negative-going portions of the wave substantially equal to zero and the difference between the time-average value and one extreme value constant. As shown in FIG. 2b between times T1 and T7 representing 63 microseconds of a horizontal deflection interval, and with 160 volts of unregulated voltage applied to regulator 20, the voltage V30a across winding 30a is 120 volts in a first polarity for 15.75 microseconds and 40 volts of the opposite polarity for 47.25 microseconds. At a time after T10, when the unregulated supply voltage may be 200 volts, the positive-going portion of the voltage across winding 30a is maintained at 120 volts for 25.2 microseconds and at 80 volts in the opposite polarity for 37.8 microseconds. In both cases, the product of voltage multiplied by time in the positive-going direction equals the negative of the product in the negative direction, and the average direct current in the primary winding is zero. Similarly, the positive-going voltage across primary winding 30a in the interval immediately following the time T1 of the leading edge of synchronizing pulse 200 during each cycle has a peak value of 120 volts relative to the average, regardless of the magnitude of the unregulated voltage.

In the interval T1–T4 during which a constant voltage appears across winding 30a, rectifier 42 conducts to charge capacitor 44 to a voltage b+ which may be equal to the primary voltage or which may be greater or less than the primary voltage by a constant transformation ratio. Similarly, winding 30c during this same interval produces a negative voltage relative to ground which causes diode 46 to conduct and produces a B— voltage across capacitor 48. Also during the interval T1 to T4 (or corresponding interval T10–T14 of a succeeding cycle) winding 30d produces a positive voltage at the anode of diode 76 and a negative voltage at the terminal of capacitor 72 remote from terminal 74, which causes diode 76 to conduct and charge capacitor 72 to a voltage which, as in the case of power supply 40, may be equal to the voltage then applied to winding 30a or which may be greater or less by a constant transformation ratio. During the interval T1–T4 of each cycle during which diode 76 is conductive, the voltage at terminal 74 available for application to winding 62a and horizontal deflection circuit 50 equals the forward junction voltage of diode 76, which is essentially zero as shown in FIG. 2c.

The voltage appearing across winding 30a during the second portion of each cycle extending from time T4 to the end T7 of the cycle will be the difference between the constant voltage appearing across winding 30a during the first half of the cycle and the applied unregulated voltage. As exemplified in FIG. 2b for the interval T4–T7, that voltage will be 40 volts which is maintained for an interval of 47.25 microseconds. Similarly, in the interval T14 to T17, 80 volts is applied for 37.8 microseconds. During the second portion T4 to T7 of each cycle, the voltage applied across winding 30a and transformed to the secondary windings reverse-biases diodes 42, 46 and 76. The B+ and B— voltages are maintained until the end T7 of the cycle by capacitors 44 and 48, respectively. Winding 30d produces a positive voltage at the end remote from ground 17. The voltage at terminal 74 is the sum of the voltage stored on capacitor 72 and the voltage then appearing across winding 30d. As illustrated in FIG. 2c, for the case of a 1:1 transformation ratio between windings 30a and 30d, the voltage at terminal 74 will be the sum of the 120 volts stored on capacitor 72 and a voltage depending upon the unregulated applied voltage. For the interval T4 to T7, 40 volts appear across winding 30d and the total at terminal 74 is 160 volts in the interval T14 to T17, the total voltage at terminal 74 will be 200. With the described arrangement, the product of the voltage applied at terminal 74 and the time during which it is applied remains constant within wide limits.

Horizontal deflection circuit 50 operates in well-known manner. The base voltage of transistor 52 applied from horizontal drive circuit 66 maintains transistor 52 enabled for conduction during the entire trace interval T3–T7 of the horizontal deflection cycle. During the first half T3–T6 of the horizontal deflection cycle, deflection winding 58 conducts a decreasing deflection current 158 as illustrated in FIG. 2d through capacitor 60 and diode 54 as magnetic energy stored in the winding is transferred to capacitor 60. With diode 54 conducting, and with transistor 52 enabled for conduction, the collector of transistor 52 is essentially at the voltage of ground 17. Consequently, the voltage appearing at terminal 74 after time T4 is impressed across winding 62a and causes a linearly increasing current 162a in the winding as illustrated in FIG. 2e. The current in winding 62a, when less than the deflection current, merely subtracts from the total current flowing in diode 54. When, as at time T5, the current in winding 62 equals the deflection current in winding 58, diode 54 becomes nonconductive. After time T5, the excess current of winding 62a over the deflection current flowing in winding 58 flows through the collector-to-emitter path of conductive transistor 52 to ground.

The deflection current continues to decrease towards zero during the first half of the trace interval, and the current in winding 62a continues to increase. At time T6, the deflection current becomes zero and all of the magnetic energy previously stored in winding 58 is transferred to capacitor 60. Transistor 52 remains conductive, carrying the increasing current in winding 62a. The current in deflection winding 58 reverses and begins to increase under the impetus of the voltage on capacitor 60. The deflection current during the second half of the trace interval adds to the current in winding 62a and flows through the collector-to-emitter path of transistor 52 to ground 17.

Immediately prior to the next succeeding retrace interval extending from T7 to T9, the deflection current and the current in winding 62a have reached a maximum. The retrace interval is initiated at time T7 when horizontal drive circuit 66 produces a negative-going synchronizing pulse 200, which removes base drive from transistor 52, rendering it nonconductive. With transistor 52 nonconductive, the current representing energy stored in the magnetic fields of windings 58 and 62a flows in a resonant manner into retrace capacitor 56, producing a retrace pulse illustrated as V56 between point 59 and ground 17. The retrace voltage pulse reverses the current in deflection winding 58. As illustrated in FIG. 2d, the deflection current in winding 58 at the beginning of the trace interval is at a maximum, and is decreasing, as described. The current in winding 62a, on the other hand, decreases during the retrace interval from a maximum value to substantially zero, preparatory for the following trace interval. Winding 62a begins the trace interval with substantially no current flow, and with the voltages at points 59 and 74 equal to zero. Consequently, no change occurs in the current of winding 62a until a later time corresponding to T4, at which time the voltage at point 74 rises, also as described. The energy stored by winding 62a is represented by its current. As illustrated in FIG. 2e, winding 62a began the retrace interval T7–T9 with a maximum current, and had almost no current at the end T9 of the retrace intervals. The energy given up by winding 62a was transferred to retrace capacitor 56 during the first half of the retrace interval, and to deflection winding 58 during the second half of the retrace interval to compensate for the losses of the deflection circuit.

When the voltage applied from the power mains at terminals 13 and 14 increases, and the unregulated direct voltage across conductors 16 and 17 increases, the voltage appearing at terminal 74 is modified both as to magnitude and duration, as described and as illustrated in FIG. 2c in the interval T10 to T17. It will be noted that, by comparison with the lower unregulated input voltage described in connection with the interval T1 to T7, that the interval T10 to T14 during which no voltage is applied to winding 62a is greater in the case of the greater unregulated voltage. Nevertheless, as a result of the constant product of the voltage at terminal 74 and the time during which it is applied, the current 162 in winding 62a at the end of the deflection interval remains the same as was the case with the lesser applied unregulated voltage. Consequently, the energy stored in winding 62a at the end of each horizontal trace interval is a constant, regardless of the magnitude of the applied unregulated voltage, and the deflection is stabilized against changes in the applied voltage. As described in the aforementioned Scott patent, the B+ and B− voltages are also regulated against changes in the applied unregulated voltage.

Current flows in secondary winding 30d in a first direction when diode 76 conducts, and in the reverse direction during the remainder of the trace interval. Thus, there is no net or average direct current flow in winding 30d, and bias of the magnetic core of transformer 30 is reduced. Since the horizontal deflection circuit of a television receiver uses a major portion of the entire power required by the receiver, there will be a substantial reduction of core saturation attributable to the use of a rectifier 70 as compared with the use of a half-wave rectifier arrangement such as 40. This substantial reduction in average direct current flow will improve the characteristics of a transformer of a size suited to half-wave use, or alternatively the reduced direct current may allow a smaller transformer core to be used.

Figure 3:
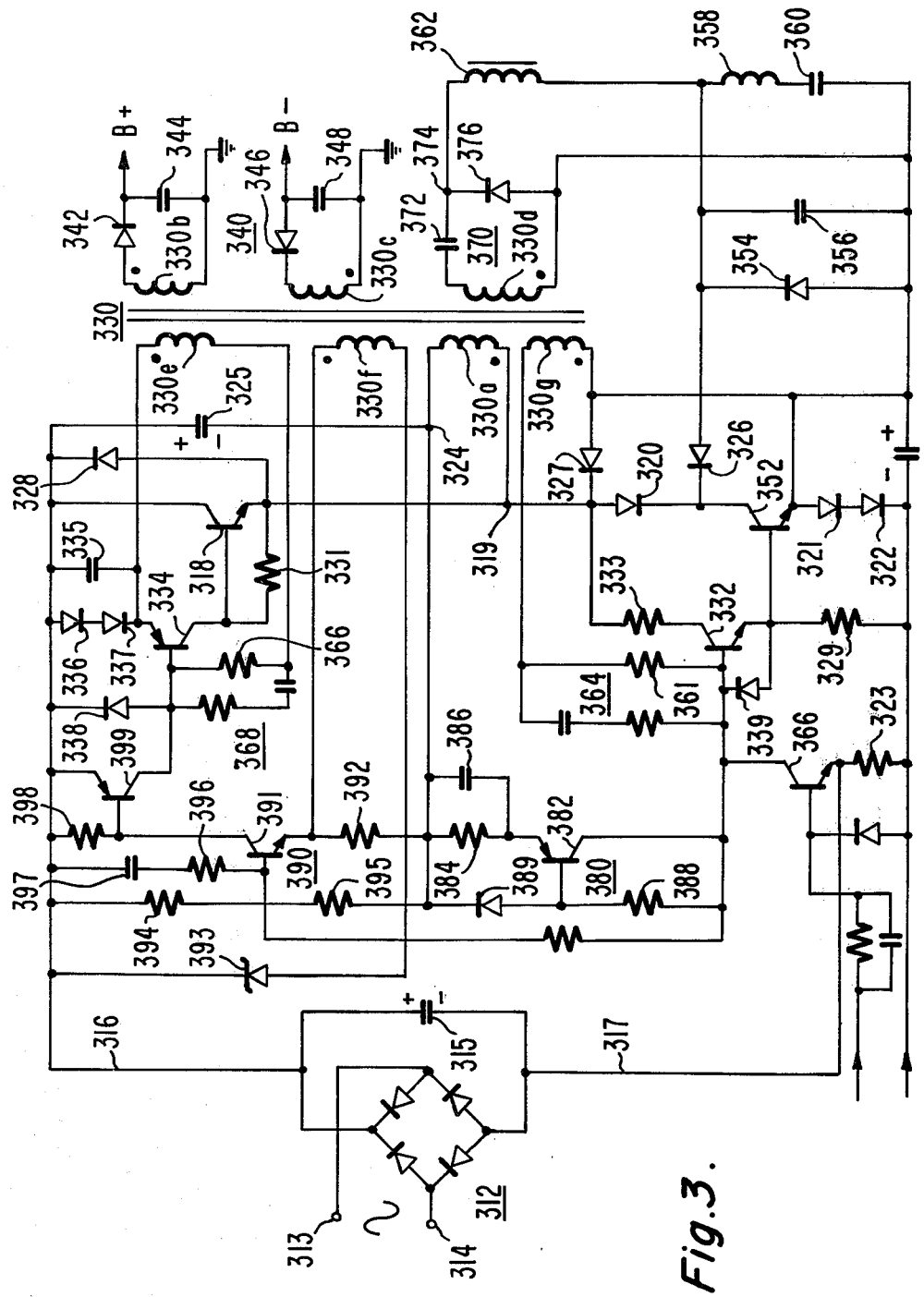

FIG. 3 illustrates a particularly advantageous embodiment of the invention in which the same transistor serves both as the horizontal output switch and as a switch in the switched regulator circuit. In FIG. 3, a full-wave bridge rectifier designated generally as 312 is adapted to be coupled to the ac power mains at terminals 313 and 314, and produces pulsating dc on conductors 316 and 317. A filter capacitor 315 connected between conductors 316 and 317 filters the pulsating dc to form unregulated direct voltage. An NPN switching transistor 318 has its collector connected to conductor 316 and its emitter connected by way of a terminal 319 to one end of the primary winding 330a of a transformer 330. Terminal 319 is coupled to conductor 317 by a current path including a diode 320, the collector-to-emitter path of an NPN switching transistor 352, diodes 321 and 322 and a low-value resistor 323. The end of winding 330a remote from terminal 319 is connected to a terminal 324. Terminal 324 is coupled to conductor 316 by a filter capacitor 325.

A low-voltage power supply designated generally as 340 includes rectifier-filter combinations 342, 344 and 346, 348 coupled to secondary winding 330b and 330c, respectively, to form B+ and B− voltages. A pulsating direct voltage generator 370 includes a capacitor 372 and rectifier diode 376 energized by a transformer secondary winding 330d. An output terminal 374 of supply 370 is coupled by means of an inductor 362 and a diode 326 to the collector of transistor 352. A damper diode 354 is connected between the anode of diode 326 and the emitter of transistor 352. Diode 354 is paralleled by a retrace capacitor 356 and by the series combination of a deflection winding 358 and S-shaping capacitor 360.

A commutating diode 327 has its anode connected to the emitter of transistor 352 and its cathode connected to terminal 319. Another commutating diode 328 has its anode connected to the emitter of transistor 318 and its cathode connected to conductor 316.

The base of transistor 352 is coupled to the cathode of diode 322 by a resistor 329. The base of transistor 318 is coupled to its emitter by a resistor 331. The base of transistor 352 is connected to the emitter of an NPN driver transistor 332, the collector of which is coupled to terminal 319 by a resistor 333. The base of transistor 318 is connected to the collector of a PNP driver transistor 334, the emitter of which is coupled to conductor 316 by a capacitor 335. Capacitor 335 is paralleled by the serial combination of diodes 336 and 337. A protective diode 338 has its anode connected to the base of transistor 334 and its cathode connected to conductor 316. A protective diode 339 has its cathode connected to the base of transistor 332 and its anode connected to its emitter.

A secondary winding 330g of transformer 330, poled as shown, has one end connected to the emitter of transistor 352 and the other end coupled by means of a resistor 361 to the base of transistor 332. Resistor 361 is paralleled by a pulse-forming network designated generally as 364. Similarly, a secondary winding 330e poled as shown is coupled by means of a resistor 366 across the base-emitter junction of transistor 334. A pulse-forming network designated generally as 368 is coupled in parallel with resistor 366.

A constant-current source designated generally as 380 includes a PNP transistor 382 having its collector coupled to the base of transistor 332 and its emitter coupled by way of a resistor 384 to terminal 324. Resistor 384 is paralleled by a filter capacitor 386. The base and collector of transistor 382 are coupled together by a resistor 388. A zener diode 389 has its anode connected to the base of transistor 382 and its cathode coupled to terminal 324, and receives bias current from resistor 388.

A comparator designated generally as 390 includes an NPN transistor 391 having its emitter coupled to terminal 324 by a resistor 392. A zener diode 393 has its cathode coupled to conductor 316 and its anode coupled by means of a secondary winding 330f of transformer 330 to the emitter of transistor 391. The base of transistor 391 is coupled to the tap on a voltage divider consisting of resistors 394 and 395 coupled between conductor 316 and terminal 324. The base of transistor 391 is also coupled to conductor 316 by the serial combination of a resistor 396 and a capacitor 397. A resistor 398 is coupled between the collector of transistor 391 and conductor 316. A PNP transistor 399 has its emitter connected to conductor 316 and its base connected to the collector of transistor 391. The collector of transistor 399 is connected to the base of transistor 334.

An NPN transistor 366 has its emitter connected to conductor 317 and its collector connected to the base of transistor 332.

When alternating current is applied to terminals 313 and 314, rectifier 312 produces unregulated direct voltage which is positive on conductor 316 relative to terminal 317. The applied voltage causes an initial current flow through capacitor 325 to terminal 324, through constant-current source 380, the base-emitter junction of transistor 332 and through resistors 323 and 329 back to conductor 317. This makes transistor 332 conductive, and causes a voltage drop across resistor 329 which is applied across the base-emitter junction of transistor 352 and across diodes 321 and 322, rendering them conductive. This allows a current which increases with time under the influence of the inductance of winding 330a to flow through capacitor 325, winding 330a and diode 320, through the collector-emitter path of transistor 352, through diodes 321 and 322 and resistor 323 back to conductor 317. As current flows in these initial current paths, the voltage across capacitor 325 increases, and terminal 324 assumes a voltage intermediate that of conductors 316 and 317.

When an initial base current flows in transistors 332 and 352, rendering them conductive, terminal 324 is made positive with respect to terminal 319. Consequently, a positive voltage relative to the emitter voltage of transistor 352 is induced in secondary winding 330g. This positive voltage is applied by way of pulse-forming network 364 and resistor 361 to the base-emitter junctions of transistors 332 and 352, holding them in conduction. At the same time, a voltage is induced in winding 330e which reverse-biases the base-emitter junction of transistor 334, thereby maintaining transistors 334 and 318 nonconductive.

The voltage across winding 330a also produces a voltage across winding 330f holding the emitter of transistor 391 negative and maintaining transistor 391 conductive. This in turn holds transistor 399 conductive, which prevents any transients from turning on transistors 334 and 318.

In the absence of synchronizing pulses applied to the base of transistor 366, the current through capacitor 325, winding 330a, diodes 320 through 322 and transistor 352 continues to increase until the core of transformer 330 saturates. With transformer 330 saturated, there is no further change in flux linkages through winding 330g and no voltage is developed across the winding tending to hold transistors 332 and 352 in conduction. The base-emitter current in transistors 332 and 352 decreases and the current through winding 330a and transistor 352 begins to decrease. The reversal of the rate of change of current in winding 330a reverses the voltage produced by windings 330g and 330e. Winding 330g produces a voltage tending to turn off transistor 352, and winding 330e produces a voltage tending to turn on the base-emitter junction of transistor 334, which in turn makes transistor 318 conductive. This produces a regenerative action which switches transistors 332 and 352 OFF and transistors 334 and 318 ON.

The energy stored in the magnetic field associated with winding 330a tends to make terminal 319 positive with respect to terminal 324 in order to maintain the flow of current in the winding. As a result, diode 328 becomes conductive and capacitor 325 continues to charge through diode 328 as the energy stored in the magnetic field of winding 330a is given up. With diode 328 conductive, capacitor 325 is coupled across winding 330a, and impresses a voltage across the winding which causes the current to be reduced to zero.

When the current in winding 330a reaches zero, diode 328 becomes nonconductive, but the voltage across capacitor 325 continues to be applied across winding 330a due to conduction of transistor 318. This voltage applied to winding 330a causes a reversal of the current in winding 330a, and capacitor 325 begins to discharge through transistor 18 and winding 330a. During this interval in which the voltage of capacitor 325 is impressed across winding 330a, diodes 342, 346 and 376 are conductive and charge their related capacitors.

As capacitor 325 discharges through transistor 318 and winding 330a, the voltage at the emitter of transistor 391 is maintained at a reference potential established by zener diode 393 plus an additional voltage attributable to winding 330f. The additional voltage provided by winding 330f provides a hysteresis action to comparator 390 which tends to stabilize its operation.

The voltage across capacitor 325 also appears across the voltage divider consisting of resistors 394 and 395, and a portion thereof appears at the base junction of transistor 391. As capacitor 325 discharges through transistor 318 and winding 330a, the voltage at terminal 324 becomes more positive and this voltage, translated to the base of transistor 391, turns on transistor 391 when capacitor 325 has achieved the reference value. Turn-on of transistor 391 turns on transistor 399, bypassing base current away from the base-emitter junction of transistor 334. This renders transistors 334 and 318 nonconductive.

With transistor 318 nonconductive, the current in winding 330a decreases, causing a regenerative turn-on of transistors 332 and 352 and regeneratively aiding turn-off of transistors 334 and 318. With transistor 352 once again conductive, current flows through capacitor 325, winding 330a and transistor 352, charging capacitor 325 to initiate another cycle.

As a result of the cyclic charge and discharge of capacitor 325 through winding 330a, voltages and currents are induced in secondary windings 330b, 330c and 330d in a manner similar to that described in conjunction with FIG. 1. As described in the aforementioned Scott patent, the voltage across capacitor 325 is maintained relatively constant under conditions of high and low power-line voltage by variation of the conduction duty cycle of transistor 352 relative to transistor 318.

Operation of the regulator and deflection circuit is synchronized by positive-going pulses synchronized with the horizontal synchronizing pulses produced by the remainder of the television receiver, not shown. These pulses when applied to the base of transistor 366 render transistor 366 conductive, bypassing base current away from transistors 332 and 352 and initiating turn-off of these transistors prior to saturation of transformer 330. Turn-off of transistor 352 initiates a retrace pulse across capacitor 356 to reverse deflection current in winding 358, and at the same time initiates regenerative turn-on of transistors 334 and 318.

What is claimed is:

1. An improved energizing circuit for a television horizontal deflection circuit comprising:
   a source of alternating voltage, the voltage cycling at the horizontal deflection rate between first and second magnitudes relative to an average value, said second magnitude being variable and said first magnitude being maintained constant by variation of the relative duration during the cycle of first and second intervals, respectively, during which said first and second voltage magnitudes recur;
   a transformer, the primary of which is coupled to said source of alternating voltage and including a secondary winding;
   a storage capacitor serially coupled with a rectifier, the serial combination being coupled across said secondary winding for charging said capacitor during said recurrent first intervals;
   a horizontal deflection stage including a horizontal switching transistor having a main current conduction path and a horizontal deflection winding coupled across said main current conduction path; and
   inductance means coupling said current conduction path across said rectifier means for applying the sum of said capacitor and transformer secondary voltage to said inductance means during said second intervals for causing a constant energy to be stored in said inductance means for operating said horizontal output stage during each deflection cycle.

2. A circuit according to claim 1 wherein one terminal of said rectifier is common with said horizontal deflection stage.

3. A circuit according to claim 2 wherein said rectifier is poled to conduct during the interval in which said alternating voltage takes its second magnitude for charging said storage capacitor to substantially said second magnitude.

4. A circuit according to claim 3 in which the magnitude of the voltage applied across said horizontal deflection stage is zero during said interval in which said alternating voltage takes its second magnitude.

5. In a regulating horizontal output stage including:
   horizontal output transistor means having a first main current controlling path and a first control electrode, said transistor means being rendered nonconductive during recurrent horizontal retrace intervals;
   a horizontal deflection winding;
   first rectifier means coupling said horizontal deflection winding across said first controlled current path;
   a source of unregulated direct voltage;
   a transformer including a secondary winding and a primary winding coupled between said source of unregulated voltage and one end of said first controlled current path; and
   coupling means for coupling said secondary winding with said deflection winding for transferring energy thereto, said coupling means including second rectifier means;
   an improved drive circuit comprising:
      capacitance means serially coupled with said primary winding;
      regulating transistor means including a second main current controlling path and a control electrode, said second current controlling path being coupled between said end of said first main current controlling path and said source of unregulated voltage;
      control means coupled to said capacitance means and to said second control electrode for periodically rendering said second current controlling path nonconductive to maintain the voltage across said capacitance means substantially constant; and
      regenerative means coupled to said first and second control electrodes and to said transformer for rendering said second controlled current path conductive when said first controlled current path is nonconductive and for rendering said first controlled current path conductive when said second controlled current path is nonconductive.

6. A horizontal stage according to claim 5 wherein said regenerative means comprises a third winding on said transformer coupled to said first control electrode and a fourth winding on said transformer coupled to said second control electrode.

* * * * *